United States Patent [19]
Wiget

[11] Patent Number: 5,361,013
[45] Date of Patent: Nov. 1, 1994

[54] DEVICE COMPRISING A PIEZOELECTRIC TRANSDUCER

[75] Inventor: Fridolin Wiget, Neuchâtel, Switzerland

[73] Assignee: Asulab S.A., Bienne, Switzerland

[21] Appl. No.: 9,053

[22] Filed: Jan. 26, 1993

[30] Foreign Application Priority Data

Feb. 6, 1992 [FR] France ............... 92 01437

[51] Int. Cl.5 .......................... H01L 41/08
[52] U.S. Cl. ...................... 310/316; 310/317
[58] Field of Search ............ 310/316, 317, 319; 318/116

[56] References Cited

U.S. PATENT DOCUMENTS

| | | | |
|---|---|---|---|
| 4,161,670 | 7/1979 | Kern | 310/316 |
| 4,732,129 | 3/1988 | Takigawa et al. | 310/316 X |
| 4,767,959 | 8/1988 | Sakakibara et al. | 310/317 |
| 4,947,074 | 8/1990 | Suzuki | 310/316 |
| 5,036,263 | 7/1991 | Yamada et al. | 310/316 |
| 5,053,668 | 10/1991 | Mitsuyasu | 310/317 |
| 5,057,734 | 10/1991 | Tsuzuki et al. | 310/317 |
| 5,204,576 | 4/1993 | Mitsuyasu | 310/317 |
| 5,208,505 | 5/1993 | Mitsuyasu | 310/317 |

FOREIGN PATENT DOCUMENTS 2329445 5/1977 France .

Primary Examiner—Mark O. Budd
Attorney, Agent, or Firm—Pollock, Vande Sande & Priddy

[57] ABSTRACT

The device comprises a piezoelectric transducer, a primary battery, and a circuit which applies a control voltage to the transducer or which short-circuits the latter depending on the state of a control signal. The control voltage is produced by a voltage increasing circuit comprising a coil, a diode and a capacitor constituted by the transducer, that are connected in series, in that order, across the terminals of the primary battery, and an oscillator responsive to the control signal to control a transistor in such a manner that it either alternately produces and cancels a short circuit across the terminals of the circuit formed by the diode and the transducer or is permanently blocked. A second transistor is also responsive to the control signal to short-circuit the transducer when the first transistor is blocked. The device is simpler, cheaper and consumes less electrical power than known devices.

4 Claims, 2 Drawing Sheets

DEVICE COMPRISING A PIEZOELECTRIC TRANSDUCER

FIELD OF THE INVENTION

The present invention relates to a device comprising a piezoelectric transducer, a supply source of electrical power producing a first voltage and control means responsive to a first state of a control signal for applying to said transducer a control voltage and to a second state of said control signal for short-circuiting said transducer, said control means including voltage increasing means that are responsive to said first voltage to produce said control voltage and which include a coil, a diode and a capacitor that are connected in series, in that order, across the terminals of said supply source, and means for alternately producing and cancelling a short circuit across the terminals of the circuit formed by said diode and said capacitor.

BACKGROUND OF THE INVENTION

A piezoelectric transducer is very often used to cause a mechanical element to move over a short and well-defined distance in response to a control signal.

It is not possible to mention here all of the mechanical elements that can be moved in this way. Suffice it to mention, by way of non limitative example, the diaphragm of a micro-pump intended to inject into a patient a medicament at a very small and precisely set rate, or the tool holder of a machine intended to machine a workpiece with great accuracy.

Piezoelectric transducers have two electrodes that are deposited on a body of piezoelectric material which becomes deformed in response to the application of a control voltage across the electrodes to cause the mechanical element to which it is coupled to move.

The shape and size of the body of piezoelectric material, the arrangement of the electrodes on the body and the manner in which the latter is coupled to the mechanical element having to be moved will not be described here as they depend on the use of the transducer and may therefore vary widely.

The control voltage having to be applied to these transducers to make them work, i.e. for their body of piezoelectric material to become deformed in the required manner, is generally greater than 50 volts, and very often much greater than 100 volts.

Now, portable apparatuses fitted with such transducers obviously have to be supplied by an autonomous supply source, which may only consist of primary batteries or recharge able accumulators. In many cases, the available space in such apparatuses is so limited that this source may only consist of one single primary or rechargeable cell.

Thus, in the great majority of cases, the voltage supplied by the electrical power source of portable apparatuses equipped with a piezoelectric transducer is far too low to energize the latter. These portable apparatuses must therefore include a control device able to produce the high voltage needed for the transducer's operation off the low voltage produced by their supply source, and to apply this high voltage to the transducer when the latter is required to operate.

FIG. 1 diagrammatically illustrates a known device for use in such a portable apparatus.

This device, generally referenced 1, comprises a piezoelectric transducer 2, an electrical power supply source 3 consisting for instance of a primary cell supplying a voltage of around 1.5 V, a voltage increasing circuit 4 for supplying, from this relatively low voltage, the high control voltage required for the operation of transducer 2, and a switching circuit 5 for applying the control voltage to transducer 2 or for short-circuiting the latter depending on whether or not it needs to be deformed.

The positive terminal and the negative terminal of cell 3 are respectively referenced 3a and 3b, and in the remainder of this description it will be assumed that the potential of terminal 3b is the reference potential of device 1. All voltages mentioned hereinafter will thus be voltages that are measured with reference to terminal 3b.

The voltage increasing circuit 4 has two supply terminals 4a and 4b that are respectively connected to the positive terminal 3a and to the negative terminal 3b of cell 3, a capacitor 6 and a circuit 7 for charging capacitor 6.

Charging circuit 7 comprises a coil 8 and a diode 9 which are series-connected, in that order, across terminal 4a and one of the terminals of capacitor 6, the other terminal of capacitor 6 being connected to terminal 4b.

Charging circuit 7 also comprises a MOS transistor 10 whose source and drain are respectively connected to supply terminal 4b and to the connection point A between coil 8 and diode 9. The channel of transistor 10 is thus connected in parallel with the circuit formed by diode 9 and capacitor 6.

The gate of transistor 10 is connected to the output 11a of an oscillator circuit 11 supplied by cell 3 and which has a control input 11b whose function will be described below.

Control input 11b is connected to the common point B of two series-connected resistors 12 and 13 forming a voltage divider which is connected in parallel with capacitor 6.

Oscillator circuit 11 comprises a reference voltage source, not shown separately, which supplies a voltage Ur, and is so arranged that when its input 11b is at a lesser voltage than voltage Ur, its output 11a issues a periodic signal which alternately renders transistor 10b conductive and non- conductive, and that when its input 11b is at a voltage greater than voltage Ur, its output 11a issues a continuous signal which permanently blocks transistor 10. Oscillator circuit 11 is well-known to specialists and will not be described in greater detail here.

The values of resistors 12 and 13 are so selected that voltage Ub at point B, which is also the voltage of input 11b of oscillator 11, is equal to the abovementioned reference voltage Ur when voltage Uc across the terminals of capacitor 6, which is also the voltage supplied by circuit 4 to its output 4a, is equal to the control voltage Ut required for the operation of transducer 2.

Thus, as long as voltage Uc is less than control voltage Ut, voltage Ub is less than reference voltage Ur and transistor 10 is alternately put in its conductive state and its non- conductive state by the signal supplied by the output 11a of oscillator 11.

As long as transistor 10 is conductive, it lets a current through from terminal 3a to terminal 3b of cell 3 via coil 8.

Whenever transistor 10 becomes non-conductive, this current is diverted through diode 9 to capacitor 6 and charges the latter, due to the fact that the voltage at point A then increases until it reaches a value greater than that of voltage Uc.

Voltage Uc thus progressively increases until it exceeds voltage Ut with the result that voltage Ub becomes greater than voltage Ur. Oscillator 11 then stops being operative and transistor 10 becomes non-conductive.

This situation does not change until capacitor 6 discharges and voltage Uc drops back to a value less than voltage Ut, with the result that voltage Ub again becomes less than voltage Ur.

Oscillator 11 then starts being operative again and capacitor 6 is again charged as described above.

Voltage Uc is thus continuously substantially equal to control voltage Ut, the characteristics of the various components of circuit 4, in particular the frequency of the periodic signal issuing from the output 11a of oscillator 11 when the latter is operating and the hysteresis of the circuit which, in oscillator 11, compares voltage Ub to reference voltage Ur, being so selected that the difference between voltages Uc and Ut will always be small.

Switching circuit 5, which is intended for applying to transducer 2 the voltage Uc produced by the voltage increasing circuit 4 in the manner just described, includes a MOS transistor 14 whose source is connected to the negative terminal 3b of cell 3 and whose drain is connected to the output 4c of the voltage increasing circuit via a resistor 15. The gate of transistor 14 is connected to a terminal 5a for receiving a control signal described below.

Circuit 5 further comprises another MOS transistor 16 whose drain is directly connected to the output 4c of circuit 4 and whose source is connected firstly to the drain of transistor 14 via a diode 17 and secondly to an output terminal 5b via a resistor 18. The gate of transistor 16 is connected to the drain of transistor 14.

One of the electrodes of transducer 2, referenced 2a, is connected to the above-mentioned output terminal 5b, and the other electrode of transducer 2, referenced 2b, is connected to a second output terminal, 5c, which is itself connected to the negative terminal 3b of cell 3. This second output terminal 5c could in fact be dispensed with, the second electrode 2b of transducer 2 being then connected, for instance, directly to the terminal 3b of cell 3.

The circuit that applies to the terminal 5a of switching circuit 5 the above-mentioned control signal has not been shown as its structure depends on the nature of the apparatus of which device 1 forms part. Suffice it to note that, whatever its structure, the circuit is so designed that the above control signal selectively takes up a first state in which it renders transistor 14 nonconductive and a second state in which it renders transistor 14 conductive.

In the FIG. 1 example, the control signal may have the same potential as the negative terminal 3b of cell 3 when it is in its first state and have the same potential as the positive terminal 3a of cell 3 when it is in its second snare.

It will readily be seen that when this control signal is in its first state and the transistor 14 is blocked, transistor 16 is conductive. The voltage Uc produced by the voltage increasing circuit 4 is thus applied across the electrodes 2a and 2b of transducer 2, thereby causing the desired deformation of the transducer's body made of piezoelectric material of transducer 2 and the displacement of the mechanical element connected thereto.

It will also readily be seen that, when the control signal applied to the input 5a of switching circuit 5 is in its second state and transistor 14 is conductive, transistor 16 is blocked. Transducer 2 is therefore disconnected from voltage increasing circuit 4 and its electrodes 2a and 2b are practically short-circuited. Transducer 2 is thus in its state of rest.

Diode 17 only serves to improve the blockage of transistor 16 when transducer 14 is conductive, and resistor 17 serves to limit the current that flows either through transistor 16 at the instant when the latter is rendered conductive, or through transistor 14, also at the instant when the latter is rendered conductive.

The capacitor 6 of voltage increasing circuit 4 generally has quite a large capacity, of the order of a few microfarads. Additionally, capacitor 6 must of course also be able to withstand the high voltage produced by circuit 4. It follows that capacitor 6 is a rather bulky component that is difficult and sometimes impossible to house in the apparatus that includes device 1 when this apparatus must be portable and be of very small size. Further, capacitor 6 is a rather expensive component whose cost adversely affects the cost price of known devices such as the device 1 of FIG. 1.

Moreover, transistors 14 and 16 must also be able to withstand the high voltage produced by circuit 4 and are therefore also expensive components whose cost adversely affects the cost price of the known devices such as the FIG. 1 device.

Besides, the voltage divider formed by resistors 12 and 13 dissipates quite a large amount of electrical power because of the high voltage that is produced by circuit 4 is constantly applied thereto.

The electrical power that is dissipated by this voltage divider must of course be supplied by the cell 3, to the detriment of its lifetime.

SUMMARY OF THE INVENTION

An object of the present invention is to propose a device that fulfills the same functions as the known device that has just been described with reference to FIG. 1, but which does not suffer from its drawback, i.e. a device which, all other things being equal, has a size, a cost price and an electrical power consumption that are, less than those of this known device.

This object is achieved by virtue of the fact that the device according to the present invention, which comprises a source of electrical power producing a first voltage and control means responsive to a first state of a control signal for applying to said transducer a control voltage and to a second state of said control signal to short-circuit said transducer, said control means including voltage increasing means that are responsive to said first voltage to produce said control voltage and which include a coil, a diode and a capacitor that are connected in series, in that order, across the terminals of said supply source, and means for alternately producing and cancelling a short circuit across the terminals of the circuit formed by said diode and said capacitor, is characterized in that said capacitor is constituted by said transducer, and in that said voltage increasing means are also responsive to said first state of said control signal to produce said control voltage.

Because the capacitor forming part of the voltage increasing means is constituted by the actual transducer, the bulk and cost price of the device according to the invention are less than those of the known device described above with reference to FIG. 1 since it comprises no capacitor similar to the capacitor 6 in this latter device. Further, because the voltage increasing means respond to the first state of the control signal to produce the control voltage for the transducer, this voltage is not being produced continuously, thereby reducing electrical power dissipation by the voltage divider that is provided in the above means and which is similar to the voltage divider formed by the resistors 12 and 13 of circuit 4 in FIG. 1, as will be explained below.

BRIEF DESCRIPTION OF THE DRAWINGS

Other objects and advantages of the device according to the present invention will become apparent from the description of one embodiment thereof that will now be described with reference to the accompanying drawings, in which.

DETAILED DESCRIPTION OF A PREFERRED EMBODIMENT

Figure 2:
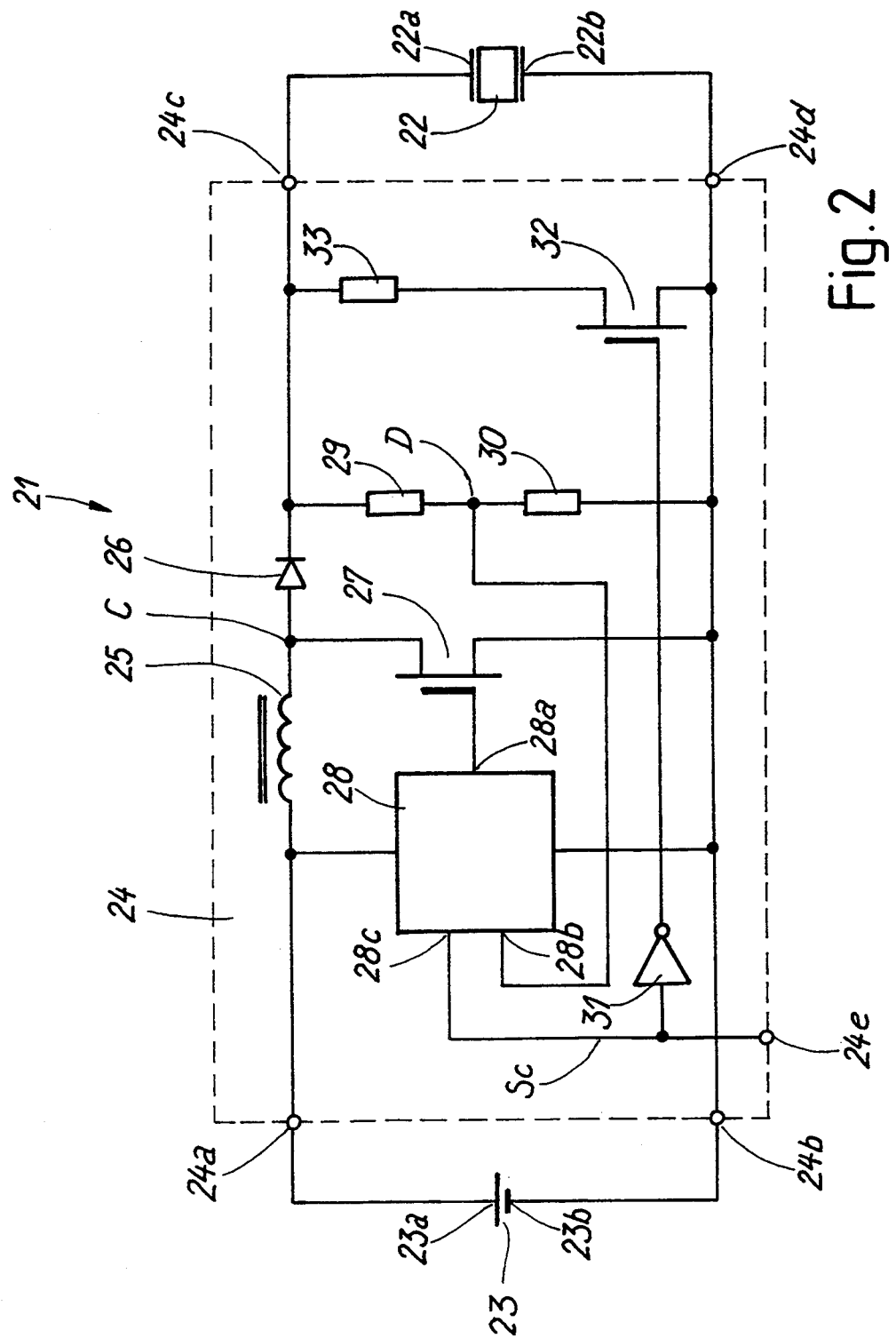
FIG. 2 is a block-diagram of an embodiment of the device according to the invention.

The device according to the invention, shown diagrammatically and by way of non limitative example in FIG. 2, is generally referenced 21.

Device 21 comprises a transducer 22 having a body made of piezoelectric material which has only been shown diagrammatically and which is meant to deform itself in a predetermined manner in response to the application, between a pair of electrodes 22a and 22b applied to the body, of a set voltage hereinafter referred to as voltage Ut.

The deformation of the transducer's body made of piezoelectric material is intended to move a mechanical element over a short and well-defined distance. This mechanical element and its connection with the transducer's body have not been shown.

Device 21 further comprises an electrical power supply source 23 which may, for instance, consist of a primary battery supplying a voltage of around 1.5 V. It will be made clear further on in this description that the value of this voltage plays practically no part in this invention and that this voltage may have any value.

The positive and negative terminals of source 23 are respectively referenced 23a 23b and the potential at terminal 23b will hereinafter be regarded as the reference potential of device 21 so that all of the voltages that will from now on be mentioned will be voltages measured with reference to terminal 23b.

Device 21 moreover comprises a circuit 24 for controlling transducer 22, which has a pair of supply terminals 24a and 24b respectively connected to the terminals 23a and 23b of source 23, a pair of output terminals 24c and 24d respectively connected to electrodes 22a and 22b of transducer 22, and an input terminal 24e whose function will be described later.

Output terminal 24d, which is connected in this embodiment to supply terminal 24b, may in fact be dispensed with, the electrode 22b of transducer 22 then being directly connected to the terminal 23b of source 23.

Control circuit 24 comprises a coil 25 and a diode 26 that are connected in series, in that order, across terminals 24a and 24c, as well as an n-type MOS transistor 27 whose source and drain are respectively connected to supply terminal 24b and to the connecting point, referenced C, between coil 25 and diode 26.

The gate of transistor 27 is connected to the output 28a of an oscillator circuit 28 which is supplied by the source 23 and which has a pair of control inputs 28b and 28c whose function will be described further on.

The control input 28b of oscillator 28 is connected to the common point D of a pair of resistors 29 and 30 that are connected to one another in series across terminals 24c and 24d, thus forming a voltage divider connected in parallel with transducer 22.

The control input 28c of oscillator 28 is connected to the terminal 24e of circuit 24 and to the input of an inverter 31 whose output is connected to the gate of an n-type MOS transistor 32. The source and the drain of transistor 32 are respectively connected to terminal 24d and, via a resistor 33, to terminal 24c. The circuit formed by the channel of transistor 32 and resistor 33 is thus also in parallel with transducer 22.

In the following description of the device 21's operation and in accordance with a generally accepted convention, the various signals that will be discussed will be said to be in the logic state low or in the logic state high depending on whether the voltage of the signals is zero, or at least close to zero, or respectively close to the voltage at terminal 24a, i.e. to the voltage supplied by supply source 23.

Transistors 27 and 32 being of the n-type and their source being connected to the terminal 24b of circuit 24, it will be apparent that they will be either nonconductive or conductive, depending on whether the signal that is being applied to their gate is low or high.

Figure 1:
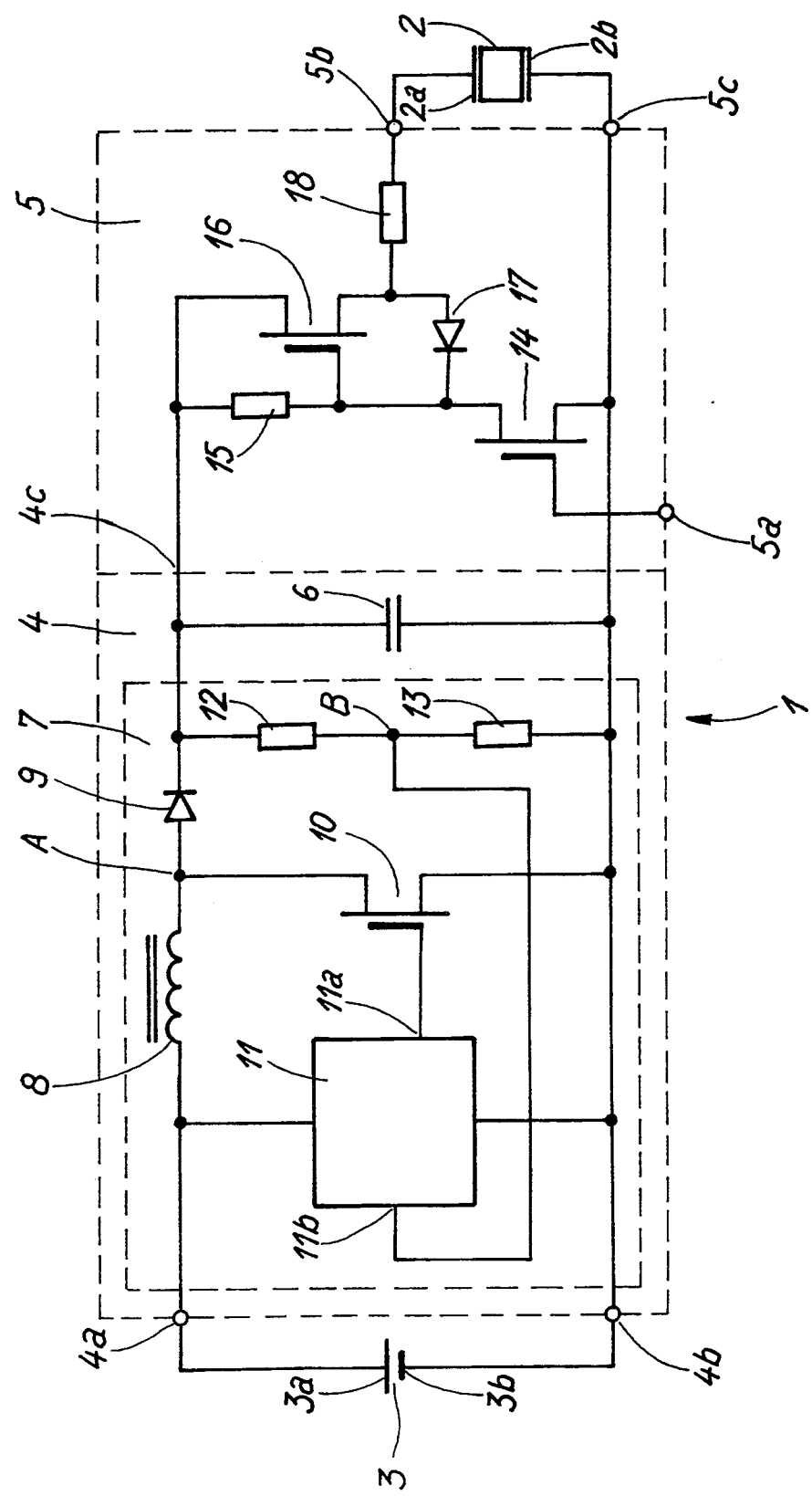
FIG. 1, referred to earlier, is a block-diagram of a prior art device.

Like circuit 11 in FIG. 1, oscillator circuit 28 comprises a reference voltage source, also not shown separately, that supplies a constant voltage which will also be termed voltage Ur. Oscillator circuit 28 is so arranged that the signal issuing from its output 28a, hereinafter termed signal 28a, alternately goes low and high when the voltage at its input 28b is less than the above defined voltage Ur and when, simultaneously, its input 28c is high. Oscillator circuit 28 is moreover so arranged that signal 28a remains continuously low when the voltage at its input 28b is greater than the voltage Ur or when its input 28c is low. Oscillator circuit 28 will not be described in detail because its construction, which can be manifold, will cause no difficulty to a man of the art.

The values of resistors 29 and 30 are so selected that the voltage at their common point D, hereafter referenced Ud, is equal to the above-mentioned voltage Ur when the voltage across the terminals of the voltage divider that they form, hereafter referenced Us, is equal to voltage Ut defined above. Voltages Ud and Us are clearly also those that are respectively applied to the input 28b of oscillator 28 and to the electrodes 22a and 22b of transducer 22.

The input 24e of circuit 24 is connected to a control circuit that applies thereto a control signal Sc and which is so arranged that signal Sc is high or low depending on whether or not transducer 22 has to be subjected to voltage Ut. This circuit has not been shown as its structure is dependent on the nature of the apparatus of which device 21 forms part.

It will readily be apparent that when signal Sc is low, transistor 32 whose gate is then high, will be conductive. Voltage Us is therefore nil, and transducer 22 is in its undeformed state.

Voltage Ud will therefore also be nil and hence less than the voltage Ur defined above. But signal 28a, however, remains continuously low since signal Sc is low. Transistor 27 is thus blocked.

When signal Sc goes high, transistor 32 becomes non conductive since its gate then goes low.

Moreover, signal 28a starts oscillating between low and high since, at that instant, voltage Ud is still nil and hence less than voltage Ur and since signal Sc is high.

When signal 28a is high, transistor 27 is conductive and lets current through from terminal 23a to terminal 23b of battery 23, via coil 25.

When signal 28a is low, transistor 27 becomes non-conductive and the above-mentioned current is diverted through diode 26 to transducer 22.

Transducer 22 forms a capacitor whose plates are formed by electrodes 22a and 22b and whose dielectric is formed by the transducer 22's body of piezoelectric material.

This capacitor is charged by the current flowing through diode 26 whenever transistor 27 becomes non-conductive, with the result that voltage Us starts increasing.

After a few periods of signal 28a, voltage Us reaches and exceeds value Ut and transducer 22 becomes deformed. At the same time, voltage Ud reaches and exceeds voltage Ur and signal 28a goes low, thereby blocking transistor 27.

This situation remains unchanged until voltage Us drops to below value Ut and until voltage Ud returns to being less than voltage Ut.

From then on, signal 28a resumes going high and low alternately and voltage Us starts increasing again with the same consequences as before.

The characteristics of the various components of circuit 21, in particular the hysteresis of the circuit which, in oscillator 28, compares voltage Ud with voltage Ur, and the frequency of signal 28a when the latter is oscillating between low and high, are obviously so chosen that the difference between voltages Us and Ut always remains small once these voltages have for the first time become equal.

So long as signal 24e is high, transducer 22 is subjected to a voltage substantially equal to voltage Ut and is in its deformed state.

When signal 24e again goes low, signal 28a also goes low and transistor 32 again becomes conductive. Voltage Us again drops to zero as the capacitor formed by transducer 22 is short-circuited. Transducer 22 thus returns to its undeformed state.

The capacitance of the capacitor formed by transducer 22 is generally very small. It is therefore easy to choose the characteristics of the various components of circuit 24 in such a way that the variations of voltage Us are very rapid when signal 24e goes from one logic state to the other. The reaction time of device 21, i.e. the time that elapses between each change in the state of signal 24e and the corresponding change in the state of transducer 22, may thus be as short as that of the known device shown in FIG. 1, despite the fact that, in device 21, the high voltage that is needed for the operation of transducer 22 is not being produced continuously.

The device according to the invention is clearly simpler than known devices like the device 1 of FIG. 1 since it does not comprise a high capacitance capacitor like capacitor 6 in FIG. 1, and since it does not comprise a circuit for applying to the transducer the high voltage needed for its operation such as the circuit formed by transistor 16, diode 17 and resistor 15 in the FIG. 1 device.

In the absence of these components, in particular the capacitor and the transistor which are expensive components, and all other things being equal, the cost price of the device according to the invention obviously is less than that of known devices.

Further, in the absence of a capacitor such as capacitor 6 in FIG. 1 which is a rather bulky component, and all other things being equal, the device according to the invention takes up less space than a known device.

In addition, in the device according to the invention, the high voltage that is needed to operate the transducer is only produced when the latter needs to be deformed.

The electrical power which is dissipated by the voltage divider formed, in the FIG. 2 embodiment, by resistors 29 and 30, is thus clearly less than that which is dissipated by the corresponding voltage divider in the known devices, i.e. that formed by resistors 12 and 13 in the FIG. 1 example.

It follows that, with all other things being equal, the lifetime of the battery supplying the device according to the invention is clearly longer than the lifetime of the battery supplying a known device.

What is claimed is:

1. A device comprising a piezoelectric transducer, an electrical power supply source for producing a first voltage and control means responsive to a first state of a control signal for applying to said transducer a control voltage and to a second state of said control signal for short-circuiting said transducer, said control means including voltage increasing means which is responsive to said first voltage to produce said control voltage and comprises a series circuit including a coil, a diode and said transducer which forms a capacitor, connected in that order, across the terminals of said power supply source, and means for selectively producing and cancelling a short circuit across the portion of said series circuit formed by said diode and said capacitor, and said voltage increasing means also being responsive to said first state of said control signal to produce said control voltage terminals of said power supply source, and means for selectively producing and cancelling a short circuit across the terminals of circuit formed by said diode and said capacitor, said capacitor being provided by said transducer and said voltage increasing means so being responsive to said first state of said control signal to produce said control voltage.

2. A device according to claim 1, wherein said voltage increasing means further comprises:

oscillator means responsive to said control signal and to said control voltage for producing an output signal that alternately goes into a first state and into a second state when said control signal is in its first state and said control voltage is less than a reference voltage, and that remains continuously in said second state when said control signal is in its second state or when said control voltage is greater than said reference voltage; and, a transistor having a current path connected to said terminals of the circuit formed by said diode and said capacitor in parallel with said circuit, said transistor being responsive to the first state of said output signal for producing said short circuit across the terminals of said circuit and to the second state of said output signal for cancelling said short circuit across the terminals of said circuit.

3. A device according to claim 1, wherein said control means further comprises a transistor having a current path connected in parallel with said transducer and responsive to the second state of said control signal for short-circuiting said transducer.

4. A device according to claim 1, wherein said control means further comprises a first transistor having a current path connected in parallel with said transducer and responsive to the second state of said control signal for short-circuiting said transducer; and wherein said voltage increasing means further comprises:

oscillator means responsive to said control signal and to said control voltage for producing an output signal that alternately goes into a first state and into a second state when said control signal is in its first state and said control voltage is less than a reference voltage, and that remains continuously in said second state when said control signal is in its second state or when said control voltage is greater than said reference voltage; and, a second transistor having a current path connected to said terminals of the circuit formed by said diode and said capacitor in parallel with said circuit, said second transistor being responsive to the first state of said output signal for producing said short circuit across the terminals of said circuit and to the second state of said output signal for cancelling said short circuit across the terminals of said circuit.

* * * * *

UNITED STATES PATENT AND TRADEMARK OFFICE
CERTIFICATE OF CORRECTION

PATENT NO. : 5,361,013
DATED : November 1, 1994
INVENTOR(S) : FRIDOLIN WIGET

It is certified that error appears in the above-indentified patent and that said Letters Patent is hereby corrected as shown below:

Column 8, line 43, after "voltage" insert --.--, and delete "terminals of said power supply source, and"; and delete lines 44-49.

Signed and Sealed this

Seventeenth Day of January, 1995

Attest:

BRUCE LEHMAN

Attesting Officer  Commissioner of Patents and Trademarks